(12) United States Patent
Reuven et al.

(10) Patent No.: US 6,788,750 B1
(45) Date of Patent: Sep. 7, 2004

(54) TRELLIS-BASED DECODER WITH STATE AND PATH PURGING

(75) Inventors: Ilan Reuven, Ramat Gan (IL); Ayelet Shahar-Doron, Modi'in (IL); Liron Frenkel, Netanya (IL); Gilad Ayalon, Hod Hasharon (IL)

(73) Assignee: Tioga Technologies Inc., San Jose, CA (US)

( * ) Notice: Subject to any disclaimer, the term of this patent is extended or adjusted under 35 U.S.C. 154(b) by 739 days.

(21) Appl. No.: 09/668,177

(22) Filed: Sep. 22, 2000

(51) Int. Cl.[7] .......................... H04L 27/06; H03M 13/03
(52) U.S. Cl. .......................... 375/341; 375/262; 714/795
(58) Field of Search .......................... 371/43; 375/260, 375/265, 341, 222, 232, 240.01, 262, 261, 240.26; 714/792, 793, 736, 786

(56) References Cited

U.S. PATENT DOCUMENTS

| | | | | |
|---|---|---|---|---|
| 5,588,028 A | * | 12/1996 | Parizhsky | 375/341 |
| 5,784,417 A | * | 7/1998 | Alamouti | 375/341 |
| 5,905,742 A | * | 5/1999 | Chennakeshu et al. | 714/792 |
| 6,094,739 A | * | 7/2000 | Miller et al. | 714/792 |
| 6,259,749 B1 | * | 7/2001 | Andoh | 375/341 |
| 6,597,743 B1 | * | 7/2003 | Khayrallah et al. | 375/265 |

OTHER PUBLICATIONS

WO94/27390 (PCT/US94/04110), Nov. 24, 1994, Method and Apparatus for Encoding Data, Crisler, Kenneth, James.*
"The Viterbi Algorithm", by G. David Forney, Jr., Proceedings of the IEEE 61,, No. 3, Mar. 1973, pp. 268/278.
"Breadth–First Trellis Decoding with Adaptive Effort", by Stanley J. Simmons,, IEEE Transactions on Communications, vol. 38, No. 1, Jan. 1990, pp. 3–12.
"Sequential Coding Algorithms: A Survey and Cost Analysis", by Anderson et al., IEEETransactinos on Communication 32 (2), pp. 169–176 (1984).

* cited by examiner

*Primary Examiner*—Stephen Chin
*Assistant Examiner*—Ted Wang
(74) *Attorney, Agent, or Firm*—Darby & Darby

(57) ABSTRACT

A method for decoding a sequence of symbols encoded by an encoding system with a plurality of possible states and transmitted over a channel, wherein the encoding system output can be represented by a trellis diagram. The method includes receiving a signal corresponding to the sequence of symbols transmitted over the channel and responsive to the signal, finding respective old state metrics for one or more of the possible states of the encoding system that correspond to a given symbol in the sequence. Respective transition metrics are determined for state transitions that link the one or more possible states for which the old state metrics were found to at least some of the possible states of the encoding system that correspond to a succeeding one of the symbols in the sequence. New state metrics are computed for the at least some of the possible states that correspond to the succeeding symbol, responsive to the respective old state metrics and to the transition metrics, such that when two or more of the transitions are linked to the same one of the possible states of the succeeding symbol, one of the transitions is chosen based on a criterion applied to the new state metrics. A subset of the at least some of the possible states that correspond to the succeeding symbol is selected based on the new state metrics and used in decoding the sequence of symbols.

55 Claims, 2 Drawing Sheets

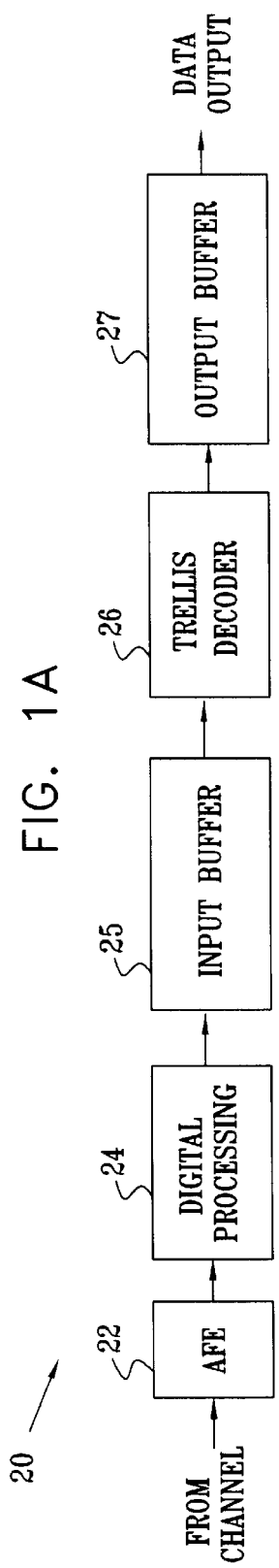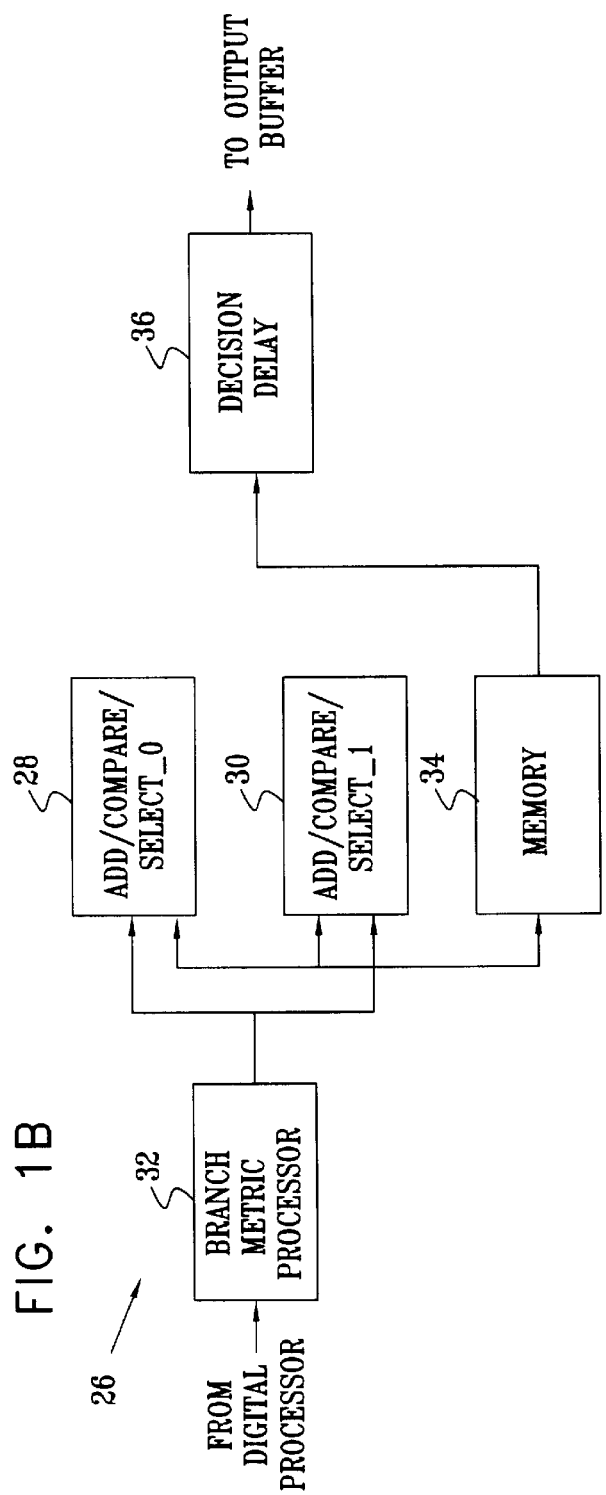

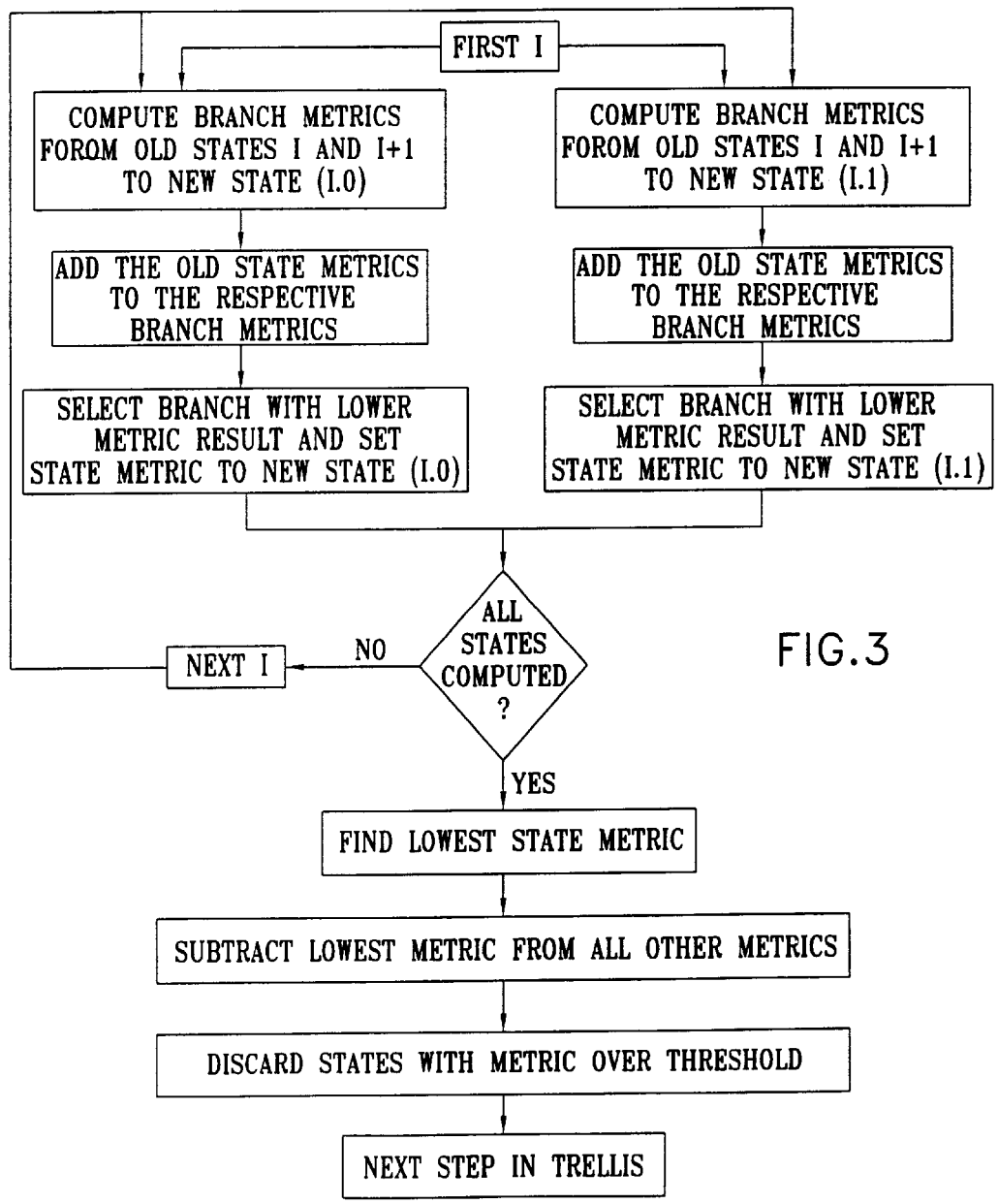

TRELLIS-BASED DECODER WITH STATE AND PATH PURGING

FIELD OF THE INVENTION

The present invention relates generally to digital data communications, and specifically to trellis-based methods for decoding digital signals.

BACKGROUND OF THE INVENTION

Trellis-based coding and decoding are well known in the art of signal processing. For example, in trellis-coded modulation (TCM), convolutional encoding and constellation mapping is applied to a sequence of input bits, to create encoded symbols to be transmitted over a noisy channel. The encoding introduces "memory" into the encoded symbols, so that each one depends on the preceding symbols. Practically speaking, trellis-based decoding can be applied to substantially any system that can be represented by a trellis diagram. A trellis-based decoder at the receiving end decodes the received symbols by hypothesizing different possible sequences of input symbols and finding the one that gives a maximum likelihood of being the correct one. Trellis-based decoding can be used in conjunction with a wide range of different coding schemes, as well as for resolving intersymbol interference in communication channels and in other signal processing applications.

In trellis-based decoding, at each point in time, the trellis has a number of vertices corresponding to the number of possible states of the encoding state machine at the corresponding time instant. Transitions between the vertices from one point in time to the next, are henceforth referred to as branches of the trellis, and are associated with the respective symbols that could have caused the transitions. A metric is computed for each branch, indicating the likelihood that the signal actually received at the given point in time resulted from the transmission of the symbol associated with the branch. Typically, the metric of a given branch provides a measure of distance between the received signal and the transmitted branch symbol. In particular, in a Gaussian channel, the logarithm of the likelihood that the received signal corresponds to the transmitted branch symbol reduces to the Euclidean distance between signals. An important property of the distance metric is that the smaller the distance, the greater the likelihood of belonging to the trellis path of the transmitted symbols in the sequence. A path through the trellis is composed of a series of interconnected branches. Each such path thus corresponds to a possible sequence of transmitted symbols and has a path metric equal to the sum of the metrics of its branches. The path with the best metric corresponds to the sequence of symbols with maximum likelihood.

The Viterbi algorithm is a mathematically-optimal maximum likelihood solution to the trellis-based decoding problem. It is described, for example, by Forney in "The Viterbi Algorithm," published in *Proceedings of the IEEE* 61(3), pages 268–278 (1973), which is incorporated herein by reference. To streamline the decoding procedure, the Viterbi algorithm retains for each vertex only the one path with the best metric, terminating at the vertex. Other branches, and their corresponding paths, are discarded. The remaining paths at any point in time are referred to as "survivors." Thus, at each section of the trellis, it is necessary to maintain only as many surviving paths as there are possible states. Nevertheless, when a system has a large number of possible states (as occurs for example in high-performance TCM schemes), the computational burden of tracking all of the survivors is still substantial.

At each step of the decoding procedure, another symbol in the sequence is decoded, by tracing back the most likely path over a certain number of symbols, known as the "decision delay." Increasing the decision delay generally increases the likelihood of correctly decoding the sequence, but at the same time incurs a greater delay in outputting the decoded symbols.

Conventional implementations of the Viterbi algorithm use two data structures: one to hold the state metrics, and the other for path history (traceback). The data structure of the state metrics holds two sets of old and new state metrics. Each set contains a plurality of state metrics according to the number of states of the encoding system, organized so that the place of the state metric in the structure corresponds to the index of the related state. The traceback data structure is arranged as a table whose dimensions are the number of states of the encoding system and the chosen decision delay. As in the state metrics data structure, the traceback data are stored so that their location in the table corresponds to the index of the related state. Each entry in the table contains a pointer indicating which preceding state was on the surviving path that led to this state.

Each step of a Viterbi decoder corresponds to an input sample to the decoder. In each step, the decoder calculates branch metrics, based on the input sample. Then, based on the old state metrics stored in the data structure and on the calculated branch metrics, a set of new state metrics is calculated. The new state metrics are calculated for each and every state in the trellis. Each new state metric is calculated by an Add/Compare/Select operation, which retains for each state only one path. The Add/Compare/Select operation for a given new state is composed of calculating the metrics for all the paths that terminate in this state, by adding the corresponding old state metrics to the connecting branch metrics, comparing the different path metrics that terminate in this state and selecting only the one path with the best metric.

As noted above, the trellis is processed by tracing back from the current symbol to the decision delay, in order to decode the symbol or bits that were received at a delay corresponding to the decision delay. The traceback starts from the state that has the highest likelihood among all states at the current symbol. The trellis path terminating at this state is declared as the winner path, and the traceback table is used to track the winner path, ending at the state to be decided upon. This path is tracked by reading the entry of the most likely state at the current symbol from the traceback table, and finding the state at the previous symbol that is connected to it on the winner path. This operation steps back one branch on the winner path. From the state found at the previous symbol, the operation is repeated, reading from the traceback table iteratively, until it reaches the earliest symbol in the table. The path thus tracked through the traceback table is the most likely path up to the current symbol. The decoder then returns the symbol or bits corresponding to the earliest transition in the most likely path that was tracked.

Alternative sub-optimal decoding approaches have been proposed, such as the M- and T-algorithms, in order to reduce the number of paths retained. Methods of this type are described, for example, by Simmons, in "Breadth-First Trellis Decoding with Adaptive Effort," published in *IEEE Transactions on Communications* 38(1), pages 3–12 (1990), by Anderson et al., in "Sequential Coding Algorithms: A Survey and Cost Analysis," published in *IEEE Transactions* on *Communications* 32(2), pages 169–176 (1984), and by Chennakeshu et al., in U.S. Pat. No. 5,905,742. These publications are incorporated herein by reference. In these methods, the number of survivors at each section of the trellis is restricted to a certain number of paths whose metrics are smaller than a given limit. In the T-algorithm, all paths whose metrics are above a given threshold (T) are discarded. In the M-algorithm, a certain number of states (M) are retained. Simmons and Chennakeshu both describe methods for adaptively varying M or T. As a result, the computational effort required at each decoding stage will tend to vary, leading also to a variable delay between symbols output by the decoder. This effect is very meaningful in T-algorithm, where the number of surviving paths can change significantly from one symbol to another, even for a fixed threshold. Simmons considers but rejects the idea of purging all but the path of the best metric in any group of paths that lead to a common state, as in the Viterbi algorithm. He notes that this additional step of path purging would require extra work and additional hardware (for VLSI implementation), while yielding only a marginal reduction in the average number of survivors to be processed.

SUMMARY OF THE INVENTION

It is an object of the present invention to provide improved methods and devices for trellis-based decoding.

It is a further object of some aspects of the present invention to provide methods for trellis-based decoding that are suited to VLSI implementation with reduced computational load.

In preferred embodiments of the present invention, a digital data receiver decodes a stream of symbols by combining Viterbi-type state-based trellis decoding with threshold-based path selection. At each step in decoding the trellis of possible states, the number of paths is pruned so that only one path reaches each new state, as in Viterbi decoding. Then some of the new states are pruned so that only states having a corresponding path metric below a chosen threshold are preserved for use in extending the possible paths at the next step.

This combination of path pruning and state pruning provides enhanced computational efficiency, particularly in applications in which the encoding system may have a large number of states. A novel parallel processing architecture and data structure are preferably used to overcome the difficulties of combining path purging and state purging that have prevented this technique from being practically implemented in the past. While preferred embodiments are described herein with reference to decoding trellis-coded signals by minimizing appropriate distance metrics, the principles of the present invention may be applied, mutatis mutandis, to estimation of state sequences of other finite-state processes by maximizing or minimizing appropriate metrics.

There is therefore provided, in accordance with a preferred embodiment of the present invention, a method for decoding a sequence of symbols encoded by an encoding system with a plurality of possible states and transmitted over a channel, wherein the encoding system output can be represented by a trellis diagram, the method including:

receiving a signal corresponding to the sequence of symbols transmitted over the channel;

responsive to the signal, finding respective old state metrics for one or more of the possible states of the encoding system that correspond to a given symbol in the sequence;

determining respective transition metrics for state transitions that link the one or more possible states for which the old state metrics were found to at least some of the possible states of the encoding system that correspond to a succeeding one of the symbols in the sequence;

computing new state metrics for the at least some of the possible states that correspond to the succeeding symbol, responsive to the respective old state metrics and to the transition metrics, such that when two or more of the transitions are linked to the same one of the possible states of the succeeding symbol, one of the transitions is chosen based on a criterion applied to the new state metrics;

selecting a subset of the at least some of the possible states that correspond to the succeeding symbol based on the new state metrics; and decoding the sequence of symbols based on the selected subset.

Preferably, each of the state metrics is indicative of a likelihood that the corresponding state lies on a trellis path of the transmitted symbols in the sequence. Most preferably, computing the new state metrics includes, when two or more of the transitions are linked to the same one of the possible states that correspond to the succeeding symbol, choosing the one of the transitions having the highest likelihood of belonging to the Trellis path of the transmitted symbols in the sequence. Alternatively or additionally, selecting the subset of the at least some of the possible states includes selecting the states having substantially the greatest likelihood of belonging to the trellis path of the transmitted symbols in the sequence, as indicated by the corresponding new state metrics.

Preferably, the trellis diagram includes a trellis of vertices linked by branches, in which the vertices correspond respectively to the possible states of the encoding system, and the branches correspond respectively to the possible transitions between the encoding system states, and finding the old state metrics includes:

selecting respective paths through the trellis leading up to the one or more of the possible states that correspond to the given symbol, each path including a linked series of the branches through the trellis, by purging the states that corresponds to the given symbol so that the one or more of the possible states include only those states whose old state metrics indicate that they have the greatest likelihood of belonging to the trellis path of the transmitted symbols in the sequence;

calculating respective path metrics for the selected paths; and setting the old state metrics equal to the respective path metrics.

In a preferred embodiment, the sequence of symbols is encoded and modulated using trellis-coded modulation.

Preferably, determining the transition metrics includes finding a measure of a distance, such that the smaller the distance, the greater the likelihood of belonging to a trellis path of the transmitted symbols in the sequence, and selecting the subset includes setting a threshold, and selecting the subset of the possible states having corresponding new state metrics smaller than the threshold.

Alternatively or additionally, determining the transition metrics includes finding a measure of a distance, such that the smaller the distance, the greater the likelihood of belonging to a trellis path of the transmitted symbols in the sequence, and computing the new state metrics includes selecting, among the two or more of the transitions that are linked to the same one of the possible states that corresponds to the succeeding symbol, the transition corresponding to the path with the lowest metric.

Further additionally or alternatively, finding the respective old state metrics includes storing the old state metrics in a data structure with an index indicating the states that correspond to the succeeding symbol, and with a pair of state metrics of a corresponding pair of states that correspond to the given symbol, from which the states that corresponds to the succeeding symbol are reached by the transitions.

Preferably, the method includes repeating, with respect to a further one of the symbols in the sequence subsequent to the succeeding one of the symbols, the steps of determining the transition metrics, computing the new state metrics, and selecting the subset of the possible states, using the at least some of the possible states of the succeeding symbol that are in the selected subset in place of the one or more of the possible states that correspond to the given symbol, and using the corresponding new state metrics in place of the respective old state metrics, so as to find a further subset of the states of the further one of the symbols for use in decoding the sequence of symbols.

There is also provided, in accordance with a preferred embodiment of the present invention, a method for trellis-based decoding, including:

receiving a signal corresponding to a sequence of symbols transmitted over a channel;

responsive to the signal, finding respective old state metrics for one or more of the possible states of the encoding system that correspond to a given symbol in the sequence;

determining respective transition metrics for state transitions that link the one or more possible states for which the old state metrics were found to at least some of the possible states of the encoding system that correspond to a succeeding one of the symbols in the sequence;

computing new state metrics for the at least some of the possible states that correspond to the succeeding symbol, responsive to the respective old state metrics and to the transition metrics; and decoding the sequence of symbols based on the selected subset, wherein finding the respective old state metrics includes storing the old state metrics in a data structure with a pair of state metrics of a corresponding pair of the possible states that corresponds to the given symbol, from which pair the possible states that correspond to the succeeding symbol are reached by the transitions.

Preferably, computing the new state metrics includes storing a list indicating a selected group of the one or more of the possible states that correspond to the given symbol with respect to which the new state metrics are to be calculated, and reading the data from the data structure responsive to the list. Alternatively, computing the new state metrics includes storing a list indicating a selected group of the one or more of the possible states that correspond to the succeeding symbol for which the new state metrics are to be calculated, and reading the data from the data structure responsive to the list.

Preferably, the data structure is packed so as to delete the possible states that correspond to the given symbol that are not in a selected group of the one or more of the possible states that correspond to the given symbol with respect to which the new state metrics are to be calculated. Most preferably, the indices in the data structure create a list indicating a selected group of the one or more of the possible states that correspond to the given symbol with respect to which the new state metrics are to be calculated, and computing the new state metrics includes reading data from the data structure responsive to the list. Alternatively or additionally, the indices in the data structure create a list indicating a selected group of the one or more of the possible states that correspond to the succeeding symbol for which the new state metrics are to be calculated, and computing the new state metrics includes reading the data from the data structure responsive to the list.

Alternatively, the data structure is unpacked so as to comprise an entry for each and every pair of the possible states of the encoding system that correspond to the given symbol.

Preferably, each value of the index of the data structure corresponds to a pair of the possible states that correspond to the succeeding symbol. Most preferably, each of the possible states that correspond to the succeeding symbol is identified by a number, and wherein a most significant bit of the number is omitted in order to generate the value of the index for the pair of the possible states.

Further preferably, computing the new state metrics includes computing the metrics for both of the pair of the possible states that correspond to the succeeding symbol substantially simultaneously. Most preferably, selecting the subset of the at least some of the possible states that correspond to the succeeding symbol includes determining substantially simultaneously, for each of the pair of the possible states, whether to include the state in a subset selected from the at least some of the possible states that correspond to the succeeding symbol based on the new state metrics for use in decoding the sequence of symbols.

There is additionally provided, in accordance with a preferred embodiment of the present invention, decoder apparatus, adapted to receive a sequence of samples of a signal, corresponding to a sequence of symbols encoded by an encoding system with a plurality of possible states, and including:

a memory, adapted to store respective old state metrics, determined responsive to the samples, for one or more of the possible states that correspond to a given symbol in the sequence of symbols, each such state metric indicative of a likelihood that the corresponding state lies on a trellis path for the transmitted symbols in the sequence;

a branch metric processor, coupled to receive the sequence of samples, and adapted to determine, responsive to the samples, respective transition metrics for state transitions that link the one or more possible states that correspond to the given symbol to at least some of the possible states that correspond to a succeeding one of the symbols in the sequence;

at least one add-compare-select processor, coupled to receive the transition metrics and further coupled to read the old state metrics from the memory, and to compute new state metrics for the at least some of the possible states that correspond to the succeeding symbol based on the respective old state metrics and the transition metrics, such that when two or more of the transitions are linked to the same one of the possible states that corresponds to the succeeding symbol, the transition having the highest likelihood of belonging to the trellis path is chosen, and further adapted to select a subset of the at least some of the possible states that correspond to the succeeding symbol having the greatest likelihood, as indicated by the corresponding new state metrics, of belonging to the trellis path; and a decision device, adapted to decode the sequence of symbols based on the selected subset.

There is further provided, in accordance with a preferred embodiment of the present invention, trellis decoding apparatus, including:

an input buffer adapted to receive a sequence of samples of a signal, corresponding to a sequence of symbols encoded by an encoding system with a plurality of possible states;

a trellis decoder, adapted to decode the sequence by processing a variable number of trellis states that correspond to different symbols in the sequence, thereby generating output data at a variable decoding rate; and an output buffer, coupled to receive and buffer the output data so that the data could be read out of the apparatus at a substantially constant output rate.

There is moreover provided, in accordance with a preferred embodiment of the present invention, decoder apparatus, adapted to receive a sequence of samples of a signal, corresponding to a sequence of symbols encoded by an encoding system with a plurality of possible states and transmitted over a channel, wherein the encoding system output can be represented by a trellis diagram, the decoder including:

a memory, adapted to store respective old state metrics for one or more of the possible states of the encoding system that correspond to a given symbol in the sequence;

a branch metric processor, coupled to receive the sequence of samples, and adapted to determine, responsive to the samples, respective transition metrics for state transitions that link the one or more possible states for which the old state metrics were found to at least some of the possible states of the encoding system that correspond to a succeeding one of the symbols in the sequence;

at least one add-compare-select processor, coupled to receive the transition metrics and further coupled to read the old state metrics from the memory, and to compute new state metrics for the at least some of the possible states that correspond to the succeeding symbol, responsive to the respective old state metrics and to the transition metrics; and a decision device, adapted to decode the sequence of symbols based on the new state metrics, wherein the memory is configured to store the old state metrics in a data structure including one or more entries, wherein each of the entries includes a pair of state metrics of a corresponding first pair of the possible states that corresponds to the given symbol, from which a second pair of the possible states that correspond to the succeeding symbol are reached by the transitions.

Preferably, when a quantity of the output data in the output buffer drops below a predetermined level, the decoder is prompted to increase the rate of generating the output data. Additionally or alternatively, the decoder decodes the sequence by evaluating the trellis states over a selected decision delay, and responsive to the prompt to increase the rate of generating the output data, the decoder alters the decision delay.

There is moreover provided, in accordance with a preferred embodiment of the present invention, a method for trellis decoding, including:

receiving a sequence of samples of a signal, corresponding to a sequence of symbols encoded by an encoding system with a plurality of possible states;

decoding the sequence using a trellis decoder with a variable computational effort, thereby generating output data at a variable decoding rate; and storing the output data in an output buffer, from which the data can be read out at a substantially constant output rate.

In a preferred embodiment, decoding the sequence includes processing a variable number of trellis states that correspond to different symbols in the sequence.

The present invention will be more fully understood from the following detailed description of the preferred embodiments thereof, taken together with the drawings in which:

BRIEF DESCRIPTION OF THE DRAWINGS

FIG. 1A is a block diagram that schematically illustrates a digital data receiver, in accordance with a preferred embodiment of the present invention;

FIG. 1B is a block diagram that schematically illustrates details of a trellis-based decoder in the receiver of FIG. 1A, in accordance with a preferred embodiment of the present invention;

FIG. 2 is a trellis diagram, which schematically illustrates two sections of a trellis of coded symbols arranged for processing by the receiver of FIG. 1, in accordance with a preferred embodiment of the present invention; and FIG. 3 is a flow chart that schematically illustrates a method for trellis-based decoding, in accordance with a preferred embodiment of the present invention.

DETAILED DESCRIPTION OF PREFERRED EMBODIMENTS

FIG. 1A is a block diagram that schematically illustrates a digital data receiver 20, in accordance with a preferred embodiment of the present invention. Receiver 20 is particularly useful in decoding signals generated by trellis-coded modulation (TCM) with rate 1/2 convolutional code. Such a code is used, for example, in pulse amplitude modulation (PAM) signals generated in Digital Subscriber Line (DSL) networks. Alternatively, the design of receiver 20 may be adapted to decode other types of trellis-based codes, including substantially any binary trellis-based code with rate 1/n or even with rate k/n (k and n integers). Further alternatively, this receiver design and the methods described hereinbelow may be adapted for use in other trellis-based decoding applications, such as resolving intersymbol interference by maximum likelihood sequence estimation, as noted in the Background of the Invention.

An analog front end (AFE) 22 of receiver 20 receives signals from a transmitter (not shown) over a communication channel. The signals correspond to a trellis-coded sequence of symbols generated by the transmitter. The AFE samples and digitizes the signals at an appropriate rate to generate a stream of digital samples. These samples are typically filtered, equalized and/or otherwise processed by digital processing circuitry 24, and are then held in an input buffer 25. The data from the input buffer are input to a trellis-based decoder 26. Decoder 26 generates a sequence of decoded data symbols or bits, as described hereinbelow, which are then held in an output buffer 27. The input and output buffers are used to compensate for variability that may occur in the decoding delay of decoder 26, so that receiver 20 can output the decoded data at a constant rate. Only the elements of decoder 26 are essential to the present invention. Appropriate designs for AFE 22 and digital processing circuitry 24 will be apparent to those skilled in the art.

FIG. 1B is a block diagram that schematically illustrates details of decoder 26, in accordance with a preferred embodiment of the present invention. For each new sample that is input to decoder 26, a branch metric processor 32 determines branch metrics for all of the relevant branches at the current section in the trellis. A pair of add/compare/select processors 28 and 30 combine these branch metrics with old state metrics read from a memory 34, to compute new metrics for the states at the current section in the trellis. These new metrics are stored in the memory for the next stage. Data about the surviving paths is stored by processors 28 and 30 in memory 34, to be used by a decision delay block 36. Further aspects of the operation of processors 28, 30 and 32, of block 36 and of data structures in memory 34 are described hereinbelow.

Block 36 chooses the data bits or symbol to be output with a selected decision delay. The delay is usually held constant, despite variations in the computational load of the decoder. If output buffer 27 gets close to empty, however, typically due to a sustained increase in the computational load, the buffer may signal delay block 36 to shorten the decision delay. As a result, the buffer will refill, and a constant rate of decoded output data is maintained. Such measures are not required in conventional Viterbi decoders, which work at a constant level of computational effort. On the other hand, sub-optimal decoders such as those described in the Background of the Invention, having variable levels of effort, use a large input buffer before the decoder in order to compensate for the variations. By contrast, the combination of the decision delay block and the output buffer provided in receiver 20 enables the receiver to output decoded data at a constant rate, with a constant decision delay. Furthermore, output buffer 27 requires relatively little memory for its implementation, since this buffer holds only the decoded data for each step in the trellis, and not all of the paths data that should be held in memory 34 for traceback purposes.

FIG. 2 is a trellis diagram that schematically illustrates possible states of two successive sections in a trellis of a sequence of symbols to be decoded by receiver 20, in accordance with a preferred embodiment of the present invention. For binary feedback-free codes, a pair of states at any given section in the trellis branches to a new pair of states at the next section, depending on whether the input bit to the encoder is "0" or "1". In the example shown in FIG. 2, the encoding state machine has a 3-bit memory. Therefore, in each section the encoder can have eight possible states, with two possible branches connecting each state of the first section (the old states) to the resultant states of the second, succeeding section (the new states). Branches marked in the figure with solid lines correspond to transitions occurring when the input bit to the encoder is "0", while those marked with dashed lines correspond to transitions with the input bit "1".

The trellis of FIG. 2 is structured so that consecutive even-numbered and odd-numbered old states map to the same pair of new states. This arrangement provides a convenient way to represent the relation between the indices of the old states and the indices of the new states connected to them. For the sake of efficiency, decoder 26 processes old states in pairs of old state i and old state i+1, for i even. Each of these states is linked by branches "0" and "1" to a corresponding pair of new states, respectively: new state i/2, which is marked as new_state(i,0), and new state $i/2+2^{v-1}$, which is marked as new_state(i,1), wherein v denotes the logarithm (base 2) of the number of states in the code. Thus, v=3 in the example of FIG. 2, but extension of this arrangement to codes with larger number of states is straightforward. For the sake of clarity, the trellis of FIG. 2 comprises only eight A states, but in other preferred embodiments of the present invention (not shown explicitly in the figures), the number states of the encoder may be much larger, for example 128, 256 or 512 states.

FIG. 3 is a flow chart that schematically illustrates a method for trellis-based decoding using decoder 26 (shown in FIG. 1B), in accordance with a preferred embodiment of the present invention. The figure shows a single stage in decoding of the trellis, corresponding to processing of a single sample received by the decoder, whereby the "old states" of FIG. 2 and their respective metrics are used to determine the "new states" to be processed and their respective metrics. The state metrics of a set of old states are stored in memory 34 of decoder 26. As described below, the old states are typically pruned at the previous stage, so that it is not necessary to process all $2^v$ of them. Referring to FIG. 2, for the sake of illustration, and without loss of generality, it will be assumed that only old states 0, 1, 3 and 6 have survived from the previous stage. Preferably, a list of these surviving old states is kept in memory 34. Alternatively or additionally, a list of the new states that are reached by a branch from one or more of the surviving old states is kept in the memory. These lists are used by the decoder in order to determine the states whose metrics are to be computed at each stage, to avoid having to scan all of the states.

When decoder 26 receives a sample, branch metric processor 32 first calculates the branch metrics leading from each of the surviving old states to each of the possible new states. In the present example, the branch metrics leading from old states 0, 1, 3 and 6 to new states 0, 1, 3, 4, 5 and 7 should be calculated. For new state 0, the branch metric processor calculates the branch metric for the branch connecting old state 0 to new state 0, and for the branch connecting old state 1 to new state 0. Add-compare-select processor 28 adds the respective branch metrics to the corresponding old path metrics that were calculated and stored in memory 34 at the previous section in the trellis, in order to find resulting new path metrics for each of the paths leading up to new state 0. Then processor 28 simply chooses the branch having the best new path metric, while the other path is discarded. The new path metric of the surviving path terminating at new state 0 is stored in memory 34.

In a similar fashion, add-compare-select processor 30 computes simultaneously the new path metric of the surviving path terminating at new state 4, also using the state metrics of old state 0 and old state 1.

The structure of decoder 26, with parallel processors 28 and 30, is advantageous in enhancing the speed of computation in VLSI implementations of the present invention. This structure is not essential, however, and other implementations will be apparent to those skilled in the art. In particular, the functions of decoder 26 may be implemented by an appropriate software-based processor, or by a combination of software- and hardware-based elements.

Decoder 26 continues this process of finding path metrics for each of the other possible new states. In the present example, there is only a single branch leading to new state 1 (from old state 3), so that in this case, only a single new path metric is calculated and stored. Similarly, metrics for new states 3, 5 and 7 are each based only on a single branch.

After all of the new path metrics have been computed for the new states, the metrics are normalized. Preferably, the lowest of all of the new path metrics is found in memory 34, and this lowest value is subtracted from all of the new state metrics. In other words, the lowest metric of the new states is set to zero. A selected threshold is used to further purge new states. The threshold is determined in advance or set adaptively, preferably depending on a level of noise in the channel (typically such that the greater the noise, the higher is the threshold). Any new states whose metrics are greater than the threshold are purged. Only the states that survive this purge are used in the next stage of decoding of the trellis. If the threshold is significantly high, in the present example, all of states 0, 1, 3, 4, 5 and 7 may survive the state purging, becoming the old states for the next stage. In this case, it will be necessary to calculate metrics at the next stage for new states 0, 1, 2, 3, 4, 5, 6 and 7. On the other hand, if the threshold is low enough so that only states 1, 4 and 5 have a metric smaller than the threshold, in the present example, then at the next stage it will be necessary to calculate metrics only for new states 0, 2, 4 and 6.

Table I below schematically represents a data structure in memory 34 that holds data for use in calculating the new state metrics, in accordance with a preferred embodiment of the present invention. It consists of a list of state indices of the new states that should be calculated and the state metrics of the surviving old states:

TABLE I

PACKED MEMORY STRUCTURE

| State index new_state (i, 0) | Metric (old state i) | Metric (old state i + 1) |
|---|---|---|
| 00 | Metric (old state 0) | Metric (old state 1) |
| 01 | | Metric (old state 3) |
| 11 | Metric (old state 6) | |

This structure is similar to that used in a conventional Viterbi decoder, but it economizes by omitting metric data for old states that have been purged and by using a state index to identify the new states that are to be calculated. The state index preferably comprises the v−1 least significant bits of the state numbers of the two new states connected to the old states whose metrics are listed in the same row in the table. For example, the first row in the table, used in calculating the path metrics for new states 0 and 4, has a state index of 00, and so forth. Preferably, the data in the table are packed in consecutive rows in ascending order of state indices, in order to reduce memory waste and simplify calculations. There is thus no row in the present example with state index 10, because old states 3 and 4 have been purged and thus new states 2 and 5 should not be processed.

Alternatively, all of the old states may be represented in the state table, providing the memory structure shown in Table II:

TABLE II

UNPACKED MEMORY STRUCTURE

| State index new_state (i, 0) | Metric (old state i) | Metric (old state i + 1) |
|---|---|---|
| 00 | Metric (old state 0) | Metric (old state 1) |
| 01 | | Metric (old state 3) |
| 10 | | |
| 11 | Metric (old state 6) | |

In this case, decoder 36 preferably decides which of the rows to access based on another table that maintains the survivor old states (0, 1, 3 and 6 in the present example) or the new states that should be calculated (0, 1, 3, 4, 5, 7), as described above. The state indices may be omitted in this memory structure, since this information is absorbed in the numbers of the rows. It is noted that the novel organization of Table II can also be used in enhancing the efficiency of conventional (constant effort) Viterbi decoders.

Each entry in memory 34 preferably includes one state index and a plurality of old state metrics that correspond to one row in Tables I and II above. Each entry comprises a single word, which is read by processors 28 and 30 in a single read operation. It will be observed that the number of entries at any stage in decoding the trellis is equal to only half the number of new states that should be calculated at this stage. Preferably, memory 34 can accommodate data corresponding to all the $2^v$ states when necessary. Alternatively, particularly when v is large, a smaller memory size may be used, relying on the assumption that some of the states will always be purged at each decoding stage. In either case, it has been found that when the encoder has a large number of states, the average computational load decreases dramatically without a significant performance degradation, relative to decoding methods known in the art, when the present method of combined state and path purging is used.

It will be appreciated that the preferred embodiments described above are cited by way of example, and that the present invention is not limited to what has been particularly shown and described hereinabove. Rather, the scope of the present invention includes both combinations and subcombinations of the various features described hereinabove, as well as variations and modifications thereof which would occur to persons skilled in the art upon reading the foregoing description and which are not disclosed in the prior art.

What is claimed is:

1. A method for decoding a sequence of symbols encoded by an encoding system with a plurality of possible states and transmitted over a channel, wherein the encoding system output can be represented by a trellis diagram, the method comprising:

receiving a signal corresponding to the sequence of symbols transmitted over the channel;

responsive to the signal, finding respective old state metrics for one or more of the possible states of the encoding system that correspond to a given symbol in the sequence;

determining respective transition metrics for state transitions that link the one or more possible states for which the old state metrics were found to at least some of the possible states of the encoding system that correspond to a succeeding one of the symbols in the sequence;

computing new state metrics for the at least some of the possible states that correspond to the succeeding symbol, responsive to the respective old state metrics and to the transition metrics, such that when two or more of the transitions are linked to the same one of the possible states of the succeeding symbol, one of the transitions is chosen based on a criterion applied to the new state metrics;

selecting a subset of the at least some of the possible states that correspond to the succeeding symbol based on the new state metrics; and decoding the sequence of symbols based on the selected subset.

2. A method according to claim 1, wherein each of the state metrics is indicative of a likelihood that the corresponding state lies on a trellis path of the transmitted symbols in the sequence.

3. A method according to claim 2, wherein computing the new state metrics comprises, when two or more of the transitions are linked to the same one of the possible states that correspond to the succeeding symbol, choosing the one of the transitions having the highest likelihood of belonging to the trellis path of the transmitted symbols in the sequence.

4. A method according to claim 2, wherein selecting the subset of the at least some of the possible states comprises selecting the states having substantially the greatest likelihood of belonging to the trellis path of the transmitted symbols in the sequence, as indicated by the corresponding new state metrics.

5. A method according to claim 1, wherein the trellis diagram comprises a trellis of vertices linked by branches, in which the vertices correspond respectively to the possible states of the encoding system, and the branches correspond respectively to the possible transitions between the encoding system states, and wherein finding the old state metrics comprises:
- selecting respective paths through the trellis leading up to the one or more of the possible states that correspond to the given symbol, each path comprising a linked series of the branches through the trellis, by purging the states that corresponds to the given symbol so that the one or more of the possible states comprise only those states whose old state metrics indicate that they have the greatest likelihood of belonging to the trellis path of the transmitted symbols in the sequence;
- calculating respective path metrics for the selected paths; and
- setting the old state metrics equal to the respective path metrics.

6. A method according to claim 1, wherein the sequence of symbols is encoded and modulated using trellis-coded modulation.

7. A method according to claim 1, wherein determining the transition metrics comprises finding a measure of a distance, such that the smaller the distance, the greater the likelihood of belonging to a trellis path of the transmitted symbols in the sequence, and
- wherein selecting the subset comprises setting a threshold, and selecting the subset of the possible states having corresponding new state metrics smaller than the threshold.

8. A method according to claim 1, wherein determining the transition metrics comprises finding a measure of a distance, such that the smaller the distance, the greater the likelihood of belonging to a trellis path of the transmitted symbols in the sequence, and
- wherein computing the new state metrics comprises selecting, among the two or more of the transitions that are linked to the same one of the possible states that correspond to the succeeding symbol, the transition corresponding to the path with the lowest metric.

9. A method according to claim 1, and comprising repeating, with respect to a further one of the symbols in the sequence subsequent to the succeeding one of the symbols, the steps of determining the transition metrics, computing the new state metrics, and selecting the subset of the possible states, using the at least some of the possible states of the succeeding symbol that are in the selected subset in place of the one or more of the possible states that correspond to the given symbol, and using the corresponding new state metrics in place of the respective old state metrics, so as to find a further subset of the states of the further one of the symbols for use in decoding the sequence of symbols.

10. A method according to claim 1, wherein finding the respective old state metrics comprises storing the old state metrics in a data structure comprising one or more entries, wherein each of the entries comprises an index indicating the states that correspond to the succeeding symbol, and a pair of state metrics of a corresponding pair of states that correspond to the given symbol, from which the states that corresponds to the succeeding symbol are reached by the transitions.

11. A method according to claim 10, wherein the data structure is unpacked so as to comprise an entry for each and every pair of the possible states of the encoding system that correspond to the given symbol.

12. A method according to claim 10, wherein computing the new state metrics comprises storing a list indicating a selected group of the one or more of the possible states that correspond to the given symbol with respect to which the new state metrics are to be calculated, and reading the data from the data structure responsive to the list.

13. A method according to claim 10, wherein computing the new state metrics comprises storing a list indicating a selected group of the one or more of the possible states that correspond to the succeeding symbol for which the new state metrics are to be calculated, and reading the data from the data structure responsive to the list.

14. A method according to claim 10, wherein the data structure is packed so as to comprise entries only for pairs of the possible states that correspond to the given symbol such that at least one of the possible states in each of the pairs for which the entries are comprised in the table is in a selected group of the one or more of the possible states that correspond to the given symbol with respect to which the new state metrics are to be calculated.

15. A method according to claim 14, wherein the indices in the data structure create a list indicating a selected group of the one or more of the possible states that correspond to the given symbol with respect to which the new state metrics are to be calculated, and wherein computing the new state metrics comprises reading data from the data structure responsive to the list.

16. A method according to claim 14, wherein the indices in the data structure create a list indicating a selected group of the one or more of the possible states that correspond to the succeeding symbol for which the new state metrics are to be calculated, and wherein computing the new state metrics comprises reading the data from the data structure responsive to the list.

17. A method according to claim 10, wherein each value of the index of the data structure corresponds to a pair of the possible states that correspond to the succeeding symbol.

18. A method according to claim 17, wherein each of the possible states that correspond to the succeeding symbol is identified by a number, and wherein a most significant bit of the number is omitted in order to generate the value of the index for the pair of the possible states.

19. A method according to claim 10, wherein computing the new state metrics comprises computing the metrics for both of the pair of the possible states that correspond to the succeeding symbol substantially simultaneously.

20. A method according to claim 19, wherein selecting the subset of the at least some of the possible states that correspond to the succeeding symbol comprises determining substantially simultaneously, for each of the pair of the possible states, whether to include the state in a subset selected from the at least some of the possible states that correspond to the succeeding symbol based on the new state metrics for use in decoding the sequence of symbols.

21. A method for trellis-based decoding, comprising:
- receiving a signal corresponding to a sequence of symbols transmitted over a channel;
- responsive to the signal, finding respective old state metrics for one or more of the possible states of the encoding system that correspond to a given symbol in the sequence;
- determining respective transition metrics for state transitions that link the one or more possible states for which the old state metrics were found to at least some of the possible states of the encoding system that correspond to a succeeding one of the symbols in the sequence;

computing new state metrics for the at least some of the possible states that correspond to the succeeding symbol, responsive to the respective old state metrics and to the transition metrics; and decoding the sequence of symbols based on the new state metrics, wherein finding the respective old state metrics comprises storing the old state metrics in a data structure comprising one or more entries, wherein each of the entries comprises a pair of state metrics of a corresponding first pair of the possible states that corresponds to the given symbol, from which a second pair of the possible states that correspond to the succeeding symbol are reached by the transitions.

22. A method according to claim 21, wherein the data structure is unpacked so as to comprise an entry for each and every pair of the possible states of the encoding system that correspond to the given symbol.

23. A method according to claim 21, wherein computing the new state metrics comprises storing a list indicating a selected group of the one or more of the possible states that correspond to the given symbol with respect to which the new state metrics are to be calculated, and reading the data from the data structure responsive to the list.

24. A method according to claim 21, wherein computing the new state metrics comprises storing a list indicating a selected group of the one or more of the possible states that correspond to the succeeding symbol for which the new state metrics are to be calculated, and reading the data from the data structure responsive to the list.

25. A method according to claim 21, wherein the data structure is packed so as to comprise entries only for pairs of the possible states that correspond to the given symbol such that at least one of the possible states in each of the pairs for which the entries are comprised in the table is in a selected group of the one or more of the possible states that correspond to the given symbol with respect to which the new state metrics are to be calculated.

26. Decoder apparatus, adapted to receive a sequence of samples of a signal, corresponding to a sequence of symbols encoded by an encoding system with a plurality of possible states and transmitted over a channel, wherein the encoding system output can be represented by a trellis diagram, the decoder comprising:

a memory, adapted to store respective old state metrics, determined responsive to the samples, for one or more of the possible states that correspond to a given symbol in the sequence of symbols, each such state metric indicative of a likelihood that the corresponding state lies on a trellis path of the transmitted symbols in the sequence;

a branch metric processor, coupled to receive the sequence of samples, and adapted to determine, responsive to the samples, respective transition metrics for state transitions that link the one or more possible states that correspond to the given symbol to at least some of the possible states that correspond to a succeeding one of the symbols in the sequence;

at least one add-compare-select processor, coupled to receive the transition metrics and further coupled to read the old state metrics from the memory, and to compute new state metrics for the at least some of the possible states that correspond to the succeeding symbol based on the respective old state metrics and the transition metrics, such that when two or more of the transitions are linked to the same one of the possible states that corresponds to the succeeding symbol, the transition having the highest likelihood of belonging to the trellis path of the transmitted symbols in the sequence is chosen, and further adapted to select a subset of the at least some of the possible states that correspond to the succeeding symbol having the greatest likelihood of belonging to the trellis path of the transmitted symbols in the sequence, as indicated by the corresponding new state metrics; and a decision device, adapted to decode the sequence of symbols based on the selected subset.

27. Apparatus according to claim 26, wherein the trellis diagram comprises a trellis of vertices linked by branches, in which the vertices correspond respectively to the possible states of the encoding system, and the branches correspond respectively to the transitions between sections of the trellis that correspond to successive symbols in the sequence, wherein the old state metrics are found by the at least one add-compare-select processor, which is adapted to choose respective paths through the trellis leading up to the one or more of the possible states that correspond to the given symbol, each path comprising a linked series of the branches through the trellis, by purging the states that correspond to the given symbol so that the one or more of the possible states comprise only those states whose old state metrics indicate that they have the greatest likelihood of belonging to the trellis path, and is further adapted to calculate respective path metrics for the selected paths, such that the old state metrics are set equal to the respective path metrics.

28. Apparatus according to claim 26, wherein the signal is generated by trellis-coded modulation of the sequence of symbols.

29. Apparatus according to claim 26, wherein the transition metrics comprise a measure of a distance, such that the smaller the distance, the greater the likelihood of belonging to the trellis path of the transmitted symbols in the sequence, and wherein the at least one add-compare-select processor is adapted to set a threshold metric level and to choose the subset of the possible states having corresponding new state metrics smaller than the threshold level.

30. Apparatus according to claim 26, wherein the transition metrics comprise a measure of a distance, such that the smaller the distance, the greater the likelihood of belonging to the trellis path of the transmitted symbols in the sequence, and wherein the at least one add-compare-select processor is adapted to select, among the two or more of the transitions that are linked to the same one of the possible states that corresponds to the succeeding symbol, the transition corresponding to the path with the lowest path metric.

31. Apparatus according to claim 26, wherein the old state metrics are stored in the memory in a data structure comprising one or more entries, wherein each of the entries comprises an index indicating the possible states that correspond to the succeeding symbol, and a pair of state metrics of a corresponding pair of the possible states that corresponds to the given symbol, from which the possible states that corresponds to the succeeding symbol are reached by the transitions, and wherein the at least one add-compare-select processor is adapted to read the old state metrics from the memory responsive to the index.

32. Apparatus according to claim 31, wherein the data structure is unpacked so as to comprise an entry for each and every pair of the possible states of the encoding system that correspond to the given symbol.

33. Apparatus according to claim 31, wherein a list is stored in the memory indicating a selected group of the one or more of the possible states that correspond to the given symbol with respect to which the new state metrics are to be calculated, and wherein the at least one add-compare-select processor reads the data from the data structure responsive to the list.

34. Apparatus according to claim 31, wherein a list is stored in the memory indicating a selected group of the one or more of the possible states that correspond to the succeeding symbol for which the new state metrics are to be calculated, and wherein the at least one add-compare-select processor reads the data from the data structure responsive to the list.

35. Apparatus according to claim 31, wherein the data structure is packed so as to comprise entries only for pairs of the possible states that correspond to the given symbol such that at least one of the possible states in each of the pairs for which the entries are comprised in the table is in a selected group of the one or more of the possible states that correspond to the given symbol with respect to which the new state metrics are to be calculated.

36. Apparatus according to claim 35, wherein the indices in the data structure create a list indicating a selected group of the one or more of the possible states that correspond to the given symbol with respect to which the new state metrics are to be calculated, and wherein the at least one add-compare-select processor reads the data from the data structure responsive to the indices.

37. Apparatus according to claim 35, wherein the indices in the data structure create a list indicating a selected group of the one or more of the possible states that correspond to the succeeding symbol for which the new state metrics are to be calculated, and wherein the at least one add-compare-select processor reads the data from the data structure responsive to the indices.

38. Apparatus according to claim 31, wherein each value of the index of the data structure corresponds to a pair of the possible states that correspond to the succeeding symbol.

39. Apparatus according to claim 31, wherein each of the possible states that corresponds to the succeeding symbol is identified by a number, and wherein a most significant bit of the number is omitted in order to generate the value of the index for the pair of the possible states.

40. Apparatus according to claim 31, wherein the at least one add/compare/select processor is adapted to compute the metrics for both of the pair of the possible states that correspond to the succeeding symbol substantially simultaneously.

41. Apparatus according to claim 40, wherein the at least one add/compare/select processor is adapted to determine substantially simultaneously, for each of the pair of the possible states, whether to include the state in the subset.

42. Apparatus according to claim 26, wherein the at least one add-compare-select processor is adapted to store the new state metrics in the memory in place or in addition to the old state metrics, and wherein the branch metric processor is adapted to determine the transition metrics with respect to a further one of the symbols in the sequence subsequent to the succeeding one of the symbols, and wherein the at least one add-compare-select processor is adapted to compute further new state metrics responsive to the stored new state metrics, and to select a further subset of the possible states, using the further new state metrics, for use in decoding the sequence of symbols.

43. Apparatus according to claim 26, wherein the decision device decodes the symbols to generate output data at a variable decoding rate, and comprising an output buffer, coupled to receive and buffer the output data so that the data can be read out of the apparatus at a substantially constant output rate.

44. Decoder apparatus, adapted to receive a sequence of samples of a signal, corresponding to a sequence of symbols encoded by an encoding system with a plurality of possible states and transmitted over a channel, wherein the encoding system output can be represented by a trellis diagram, the decoder comprising:

a memory, adapted to store respective old state metrics for one or more of the possible states of the encoding system that correspond to a given symbol in the sequence;

a branch metric processor, coupled to receive the sequence of samples, and adapted to determine, responsive to the samples, respective transition metrics for state transitions that link the one or more possible states for which the old state metrics were found to at least some of the possible states of the encoding system that correspond to a succeeding one of the symbols in the sequence;

at least one add-compare-select processor, coupled to receive the transition metrics and further coupled to read the old state metrics from the memory, and to compute new state metrics for the at least some of the possible states that correspond to the succeeding symbol, responsive to the respective old state metrics and to the transition metrics; and a decision device, adapted to decode the sequence of symbols based on the new state metrics, wherein the memory is configured to store the old state metrics in a data structure comprising one or more entries, wherein each of the entries comprises a pair of state metrics of a corresponding first pair of the possible states that corresponds to the given symbol, from which a second pair of the possible states that correspond to the succeeding symbol are reached by the transitions.

45. Apparatus according to claim 44, wherein the data structure is unpacked so as to comprise an entry for each and every pair of the possible states of the encoding system that correspond to the given symbol.

46. Apparatus according to claim 44, wherein a list is stored in the memory indicating a selected group of the one or more of the possible states that correspond to the given symbol with respect to which the new state metrics are to be calculated, and wherein the at least one add-compare-select processor is adapted to read the data from the data structure responsive to the list.

47. Apparatus according to claim 44, wherein a list is stored in the memory indicating a selected group of the one or more of the possible states that correspond to the succeeding symbol for which the new state metrics are to be calculated, and wherein the at least one add-compare-select processor is adapted to read the data from the data structure responsive to the list.

48. Apparatus according to claim 44, wherein the data structure is packed so as to comprise entries only for pairs of the possible states that correspond to the given symbol such that at least one of the possible states in each of the pairs for which the entries are comprised in the table is in a selected group of the one or more of the possible states that correspond to the given symbol with respect to which the new state metrics are to be calculated.

49. Trellis decoding apparatus, comprising:

an input buffer adapted to receive a sequence of samples of a signal, corresponding to a sequence of symbols encoded by an encoding system with a plurality of possible states;

a trellis decoder, adapted to decode the sequence by processing a variable number of trellis states for different symbols in the sequence, thereby generating output data at a variable decoding rate; and an output buffer, coupled to receive and buffer the output data so that the data could be read out of the apparatus at a substantially constant output rate.

50. Apparatus according to claim 49, wherein when a quantity of the output data in the output buffer drops below a predetermined level, the decoder is prompted to increase the rate of generating the output data.

51. Apparatus according to claim 50, wherein the decoder decodes the sequence by evaluating the trellis states over a selected decision delay, and wherein responsive to the prompt to increase the rate of generating the output data, the decoder alters the decision delay.

52. A method for trellis decoding, comprising:

receiving a sequence of samples of a signal, corresponding to a sequence of symbols encoded by an encoding system with a plurality of possible states;

decoding the sequence using a trellis decoder with a variable computational effort, thereby generating output data at a variable decoding rate; and storing the output data in an output buffer, from which the data can be read out at a substantially constant output rate.

53. A method according to claim 52, wherein decoding the sequence comprises processing a variable number of trellis states for different symbols in the sequence.

54. A method according to claim 52, wherein decoding the sequence comprises, when a quantity of the output data in the output buffer drops below a predetermined level, increasing the rate of generating the output data.

55. A method according to claim 54, wherein decoding the sequence comprises evaluating the trellis states over a selected decision delay, and wherein increasing the rate of generating the output data comprises altering the decision delay.

\* \* \* \* \*